(12) United States Patent
Dysard et al.

(10) Patent No.: US 8,759,216 B2
(45) Date of Patent: Jun. 24, 2014

(54) COMPOSITIONS AND METHODS FOR POLISHING SILICON NITRIDE MATERIALS

(75) Inventors: Jeffrey Dysard, St. Charles, IL (US); Sriram Anjur, Aurora, IL (US); Timothy Johns, Naperville, IL (US); Zhan Chen, Aurora, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 1109 days.

(21) Appl. No.: 11/448,205

(22) Filed: Jun. 7, 2006

(65) Prior Publication Data

US 2007/0298612 A1    Dec. 27, 2007

(51) Int. Cl.
*H01L 21/302* (2006.01)
*H01L 21/336* (2006.01)
*C03C 15/00* (2006.01)
*C03C 25/68* (2006.01)

(52) U.S. Cl.
USPC .............. 438/689; 252/79.1; 451/28; 451/36; 216/89

(58) Field of Classification Search
USPC ......... 438/289; 451/28, 36; 51/309; 252/79.1
See application file for complete search history.

(56) References Cited

U.S. PATENT DOCUMENTS

| | | | |
|---|---|---|---|
| 5,196,353 A | 3/1993 | Sandhu et al. | |
| 5,230,833 A | 7/1993 | Romberger et al. | |
| 5,433,651 A | 7/1995 | Lustig et al. | |
| 5,609,511 A | 3/1997 | Moriyama et al. | |
| 5,643,046 A | 7/1997 | Katakabe et al. | |
| 5,658,183 A | 8/1997 | Sandhu et al. | |
| 5,730,642 A | 3/1998 | Sandhu et al. | |
| 5,759,917 A | 6/1998 | Grover et al. | |
| 5,773,364 A | 6/1998 | Farkas et al. | |
| 5,838,447 A | 11/1998 | Hiyama et al. | |
| 5,872,633 A | 2/1999 | Holzapfel et al. | |
| 5,893,796 A | 4/1999 | Birang et al. | |
| 5,949,927 A | 9/1999 | Tang | |
| 5,964,643 A | 10/1999 | Birang et al. | |
| 6,228,727 B1 | 5/2001 | Lim et al. | |
| 6,428,721 B1 | 8/2002 | Ina et al. | |
| 6,440,186 B1 | 8/2002 | Sakai et al. | |
| 6,468,913 B1 | 10/2002 | Pasqualoni et al. | |
| 6,521,523 B2 | 2/2003 | Lee et al. | |
| 6,524,168 B2 | 2/2003 | Luo et al. | |
| 6,527,622 B1 | 3/2003 | Brusic et al. | |
| 6,527,818 B2 | 3/2003 | Hattori et al. | |
| 6,530,968 B2 | 3/2003 | Tsuchiya et al. | |
| 6,546,939 B1 | 4/2003 | Small | |
| 6,604,987 B1 | 8/2003 | Sun | |
| 6,689,692 B1 | 2/2004 | Grover et al. | |
| 6,776,810 B1 | 8/2004 | Cherian et al. | |
| 6,887,137 B2 | 5/2005 | Lee et al. | |
| 6,964,600 B2 | 11/2005 | Belov et al. | |
| 6,971,945 B2 | 12/2005 | Liu et al. | |
| 2003/0176151 A1 | 9/2003 | Tam et al. | |
| 2004/0055993 A1 | 3/2004 | Moudgil et al. | |
| 2004/0123528 A1 | 7/2004 | Jung et al. | |
| 2005/0050803 A1 * | 3/2005 | Amanokura et al. | 51/309 |
| 2005/0181609 A1 * | 8/2005 | Kurata et al. | 438/689 |
| 2005/0194357 A1 | 9/2005 | Liu et al. | |
| 2006/0084270 A1 * | 4/2006 | Hiramitsu et al. | 438/691 |
| 2007/0209287 A1 * | 9/2007 | Chen et al. | 51/307 |
| 2007/0218811 A1 * | 9/2007 | Kurata et al. | 451/28 |

FOREIGN PATENT DOCUMENTS

WO    WO 2006035771 A1 *   4/2006   ............ H01L 21/304

OTHER PUBLICATIONS

Todd Hemenstine (Acids and bases, Table of common pKa valus) from web page http://chemistry.about.com/od/chartstables/a/pkatable.htm (Oct. 16, 2008) Used Only as Evidence for PkA Value of Uric Acid.*

\* cited by examiner

*Primary Examiner* — Nadine Norton
*Assistant Examiner* — Mahmoud Dahimene
(74) *Attorney, Agent, or Firm* — Thomas E Omhoit; Robert J Ross; Steven D Weseman

(57) ABSTRACT

The present invention provides a method for polishing silicon nitride-containing substrates. The method comprises abrading a surface of a silicon nitride substrate with a polishing composition, which comprises colloidal silica, at least one acidic component, and an aqueous carrier. The at least one acidic component has a pKa in the range of about 1 to 4.5. The composition has a pH in the range of about 0.5 pH units less than the pKa of the at least one acidic component to about 1.5 pH units greater than the pKa.

10 Claims, No Drawings

COMPOSITIONS AND METHODS FOR POLISHING SILICON NITRIDE MATERIALS

FIELD OF THE INVENTION

This invention relates to polishing compositions and methods. More particularly, this invention relates to methods for polishing silicon nitride-containing substrates and compositions therefor.

BACKGROUND OF THE INVENTION

Compositions and methods for chemical-mechanical polishing (CMP) of the surface of a substrate are well known in the art. Polishing compositions (also known as polishing slurries, CMP slurries, and CMP compositions) for CMP of surfaces of semiconductor substrates (e.g., integrated circuits) typically contain an abrasive, various additive compounds, and the like.

In general, CMP involves the concurrent chemical and mechanical abrasion of surface, e.g., abrasion of an overlying first layer to expose the surface of a non-planar second layer on which the first layer is formed. One such process is described in U.S. Pat. No. 4,789,648 to Beyer et al. Briefly, Beyer et al., discloses a CMP process using a polishing pad and a slurry to remove a first layer at a faster rate than a second layer until the surface of the overlying first layer of material becomes coplanar with the upper surface of the covered second layer. More detailed explanations of chemical mechanical polishing are found in U.S. Pat. No. 4,671,851, U.S. Pat. No. 4,910,155 and U.S. Pat. No. 4,944,836.

In conventional CMP techniques, a substrate carrier or polishing head is mounted on a carrier assembly and positioned in contact with a polishing pad in a CMP apparatus. The carrier assembly provides a controllable pressure to the substrate, urging the substrate against the polishing pad. The pad and carrier, with its attached substrate, are moved relative to one another. The relative movement of the pad and substrate serves to abrade the surface of the substrate to remove a portion of the material from the substrate surface, thereby polishing the substrate. The polishing of the substrate surface typically is further aided by the chemical activity of the polishing composition (e.g., by oxidizing agents, acids, bases, or other additives present in the CMP composition) and/or the mechanical activity of an abrasive suspended in the polishing composition. Typical abrasive materials include silicon dioxide, cerium oxide, aluminum oxide, zirconium oxide, and tin oxide.

U.S. Pat. No. 5,527,423 to Neville, et al., for example, describes a method for chemically-mechanically polishing a metal layer by contacting the surface of the metal layer with a polishing slurry comprising high purity fine metal oxide particles suspended in an aqueous medium. Alternatively, the abrasive material may be incorporated into the polishing pad. U.S. Pat. No. 5,489,233 to Cook et al. discloses the use of polishing pads having a surface texture or pattern, and U.S. Pat. No. 5,958,794 to Bruxvoort et al. discloses a fixed abrasive polishing pad.

A semiconductor wafer typically includes a substrate, such as silicon or gallium arsenide, on which a plurality of transistors have been formed. Transistors are chemically and physically connected to the substrate by patterning regions in the substrate and layers on the substrate. The transistors and layers are separated by interlevel dielectrics (ILDs), comprised primarily of some form of silicon oxide ($SiO_2$). The transistors are interconnected through the use of well-known multilevel interconnects. Typical multilevel interconnects are comprised of stacked thin-films consisting of one or more of the following materials: titanium (Ti), titanium nitride (TiN), tantalum (Ta), aluminum-copper (Al—Cu), aluminum-silicon (Al—Si), copper (Cu), tungsten (W), doped polysilicon (poly-Si), and various combinations thereof. In addition, transistors or groups of transistors are isolated from one another, often through the use of trenches filled with an insulating material such as silicon dioxide, silicon nitride, and/or polysilicon.

The traditional technique for forming interconnects has been improved by the method disclosed in U.S. Pat. No. 4,789,648 to Chow et al., which relates to a method for producing coplanar multilevel metal/insulator films on a substrate. This technique, which has gained wide interest and produces multilevel interconnects, uses chemical mechanical polishing to planarize the surface of the metal layers or thin-films during the various stages of device fabrication.

Although many of the known CMP slurry compositions are suitable for limited purposes, the conventional tend to exhibit unacceptable polishing rates and corresponding selectivity levels to insulator materials used in wafer manufacture. In addition, known polishing slurries tend to produce poor film removal traits for the underlying films or produce deleterious film-corrosion, which leads to poor manufacturing yields.

As the technology for integrated circuit devices advances, traditional materials are being used in new and different ways to achieve the level of performance needed for advanced integrated circuits. In particular, silicon nitride, silicon oxide, and polysilicon are being used in various combinations to achieved new and ever more complex device configurations. In general, the structural complexity and performance characteristics vary across different applications. There is an ongoing need for methods and compositions that allow for the removal rates of silicon nitride, silicon oxide and polysilicon materials to be adjusted or tuned during CMP to meet the polishing requirements for particular IC devices.

For example, there is a continuing need to achieve rapid silicon nitride removal rates for many IC device applications. Traditional polishing slurries have been designed for "stop on silicon nitride" applications, such as in shallow trench isolation (STI). Typical STI slurries utilize silica abrasives at high pH and high abrasive concentrations to achieve reasonable silicon nitride removal rates. The use of high abrasive particle concentrations has been associated with a high level of scratch defects in the polished devices.

Co-owned, co-pending U.S. patent application Ser. No. 11/374,238 to Chen et al. describes novel polishing compositions having a pH of about 1 to about 6 including an abrasive in combination with certain acidic components (e.g., combinations of malonic acid and an aminocarboxylic acid; stannate salts; uric acid; phenylacetic acid; or combinations of malonic acid, an aminocarboxylic acid, and sulfate) to polish silicon nitride substrates.

There is an ongoing need to develop new polishing methods and compositions that provide relatively high rates of removal of silicon nitride. The present invention provides such improved polishing methods and compositions. These and other advantages of the invention, as well as additional inventive features, will be apparent from the description of the invention provided herein.

BRIEF SUMMARY OF THE INVENTION

The present invention provides methods for polishing a silicon nitride-containing surface and polishing compositions useful in such methods. In a preferred embodiment, the present invention provides a method for polishing a silicon nitride-containing substrate. The method comprises abrading a surface of a silicon nitride-containing substrate with a polishing composition comprising colloidal silica, at least one acidic component having a pKa in the range of about 1 to about 4.5, and an aqueous carrier. The pH of the polishing composition is in the range of about 0.5 pH units less than the pKa of the at least one acidic component to about 1.5 pH units greater than the pKa.

The acidic component preferably is an inorganic acid, a carboxylic acid, an organic phosphonic acid, an acidic heterocyclic compound, a salt thereof, or a combination of two or more of the foregoing.

The composition comprises about 0.01 to about 15 percent by weight of colloidal silica and about 10 to about 100,000 ppm (0.001 to about 10 percent by weight) of at least one acidic component.

In some preferred embodiments, the removal rate for silicon oxide obtained when polishing a silicon oxide wafer is less than the corresponding silicon nitride removal rate, obtained when polishing a silicon nitride wafer with the same slurry under the same polishing condition, particularly for compositions comprising relatively low levels of colloidal silica (i.e., 0.05 to about 4 percent by weight). Typically the silicon nitride removal rate exceeds the silicon oxide removal rate by a factor of about 2 or more, more typically by a factor of about 10 or more, for compositions comprising 0.1 to about 4 percent by weight of colloidal silica. In addition, similar selectivity can be obtained for silicon nitride versus polysilicon.

In another aspect, the present invention provides a chemical-mechanical polishing method for polishing a silicon nitride-containing substrate. The method comprises the steps of contacting a surface of a silicon nitride-containing substrate with a polishing pad and an aqueous polishing composition, and causing relative motion between the polishing pad and the substrate while maintaining a portion of the polishing composition in contact with the surface between the pad and the substrate for a time period sufficient to abrade at least a portion of the substrate surface. The polishing composition comprises about 0.01 to about 15 percent by weight of colloidal silica, about 10 to about 100,000 ppm of at least one acidic component having a pKa in the range of about 1 to about 4.5, and an aqueous carrier. The pH of the polishing composition is in the range of about 0.5 pH units less than the pKa of the at least one acidic component to about 1.5 pH units greater than the pKa.

DETAILED DESCRIPTION OF THE INVENTION

The present invention provides methods for polishing a silicon nitride-containing surface. In a preferred embodiment, the method comprises abrading a surface of a silicon nitride-containing substrate with a polishing composition comprising colloidal silica, at least one acidic component having a pKa in the range of about 1 to about 4.5, and an aqueous carrier. The pH of the polishing composition is in the range of about 0.5 pH units less than the pKa of the at least one acidic component to about 1.5 pH units greater than the pKa.

The colloidal silica is present in the polishing composition in an amount in the range of about 0.01 to about 15 percent by weight. Preferably, the colloidal silica is present in the CMP composition in an amount in the range of about 0.05 to about 8 percent by weight, more preferably about 0.1 to about 4 percent by weight. The colloidal particles preferably have a mean particle size in the range of about 1 nm to about 500 nm, more preferably about 10 nm to about 50 nm, as determined by laser light scattering techniques, which are well known in the art.

The colloidal silica desirably is suspended in the polishing composition, more specifically in the aqueous carrier component of the polishing composition. When the silica is suspended in the polishing composition, it preferably is colloidally stable. The term "colloid" refers to the suspension of abrasive particles in the liquid carrier. "Colloidal stability" refers to the maintenance of that suspension over time. In the context of this invention, a silica suspension is considered colloidally stable if, when the silica is placed into a 100 mL graduated cylinder and allowed to stand without agitation for a time of 2 hours, the difference between the concentration of particles in the bottom 50 mL of the graduated cylinder ([B] in terms of g/mL) and the concentration of particles in the top 50 mL of the graduated cylinder ([T] in terms of g/mL) divided by the total concentration of particles in the abrasive composition ([C] in terms of g/mL) is less than or equal to 0.5 (i.e., ([B]−[T])/[C]≤0.5). The value of ([B]−[T])/[C] desirably is less than or equal to 0.3, and preferably is less than or equal to 0.1.

As used herein and in the appended claims, the term "colloidal silica" refers to silicon dioxide that has been prepared by condensation polymerization of $Si(OH)_4$. The precursor $Si(OH)_4$ can be obtained, for example, by hydrolysis of high purity alkoxysilanes, or by acidification of aqueous silicate solutions. Such abrasive particles can be prepared in accordance with U.S. Pat. No. 5,230,833 or can be obtained as any of various commercially available products, such as the Fuso PL-1, PL-2, and PL-3 products, and the Nalco 1050, 2327, and 2329 products, as well as other similar products available from DuPont, Bayer, Applied Research, Nissan Chemical, and Clariant.

As used herein and in the appended claims in reference to the compositions and methods of the invention, the term "at least one acidic component having a pKa in the range of about 1 to about 4.5" encompasses materials comprising at least one acidic hydrogen that has a dissociation constant corresponding to a pKa in the range of about 1 to 4.5. Accordingly, materials having a single acidic hydrogen, as well as materials having two or more acidic hydrogens fall within the scope of the acid component of the compositions. Materials that have two or more acidic hydrogens (e.g., sulfuric acid, phosphoric acid, succinic acid, citric acid, and the like) have a plurality of successive pKa values corresponding to the successive dissociation of each acidic hydrogen. For example, phosphoric acid has three acidic hydrogens, and three pKa values (i.e., 2.1, 7.2, and 12.4) corresponding to dissociation of the first, second, and third hydrogens, respectively. For materials having multiple acidic hydrogens, only one of the pKa values must be in the range of 1 to 4.5. Any other acidic hydrogen in such compounds can have a pKa within the range of 1 to 4.5, can have a pKa less than 1, or can have a pKa greater than 4.5.

The acidic component comprises about 0.001 to about 10 percent by weight (about 10 ppm to about 100,000 ppm) of the polishing composition. Preferably, the acidic component is present in the composition in an amount in the range of about 100 to about 5000 ppm, more preferably in the range of about 500 to about 2000 ppm.

The acidic component can be any inorganic or organic acid having a pKa in the range of about 1 to about 4.5. In some preferred embodiments, the acidic component can be an inorganic acid, a carboxylic acid, an organophosphonic acid, an acidic heterocyclic compound, a salt thereof, or a combination of two or more of the foregoing. Non-limiting examples of suitable inorganic acids include sulfuric acid (i.e., hydrogen sulfate ion, $HSO_4^-$), phosphoric acid, phosphorous acid, pyrophosphoric acid, sulfurous acid, and tetraboric acid). Non-limiting examples of suitable carboxylic acids include, monocarboxylic acids (e.g., benzoic acid, phenylacetic acid, 1-naphthoic acid, 2-naphthoic acid, glycolic acid, formic acid, lactic acid, mandelic acid, and the like), and polycarboxylic acids (e.g., oxalic acid, malonic acid, succinic acid, adipic acid, tartaric acid, citric acid, maleic acid, fumaric acid, aspartic acid, glutamic acid, phthalic acid, isophthalic acid, terephthalic acid, 1,2,3,4-butanetetracarboxylic acid, itaconic acid, and the like). Non-limiting examples of suitable organic phosphonic acids include, include phosphonoacetic acid, iminodi(methylphosphonic acid), DEQUEST® 2000LC brand amino-tri(methylenephosphonic acid), and DEQUEST® 2010 brand hydroxyethylidene-1,1-diphosphonic acid, both of which are available from Solutia. Non-limiting examples of suitable acidic heterocyclic compounds include uric acid, ascorbic acid, and the like. Table 1 provides a non-limiting listing of selected suitable acidic components, along with their reported pKa values. The pKa values of various inorganic and organic acids are compiled in a number of sources familiar to those of ordinary skill in the chemical arts, including, without limitation various editions of The CRC Handbook of Chemistry and Physics, published by The Chemical Rubber Company, and Lange's Handbook of Chemistry, published by McGraw-Hill, to name a few. For acids whose pKa values were not found in the literature, the pKa values were estimated using ACD/pKa dB software (Advanced Chemistry Development, Inc., Toronto, Canada).

Varying the pH of the compositions, within the limits of the invention (i.e., about 0.5 units less than the pKa to about 1.5 units greater than the pKa) will generally result in changes in silicon nitride removal rates. For example, a composition comprising about 0.5 percent by weight of colloidal silica, about 0.01 mol/L of DEQUEST® 2010 and 0.02 mol/L sulfate afforded a nitride removal rate of about 650 Å/min at pH 2.2, while at pH 3, the removal rate was about 300 Å/min when measured under the same polishing conditions. In other cases, the removal rate may increase with increasing pH. For example, a composition comprising about 0.5 percent by weight of colloidal silica, about 0.01 mol/L of phthalic acid and 0.02 mol/L sulfate afforded a nitride removal rate of about 300 Å/min at pH 3, while at pH 4, the removal rate was about 400 Å/min when measured under the same polishing conditions.

TABLE 1 pKa values of various acids.

| Acid | pKa | Acid | pKa | Acid | pKa |
|---|---|---|---|---|---|
| adipic | 4.43; 4.41 | itaconic | 3.85; 5.45 | sulfanilic | 3.23 |
| anisic | 4.47 | lactic | 3.08 | alpha-tartaric | 2.98; 4.34 |
| ascorbic | 4.10; 11.79 | maleic | 1.83; 6.07 | meso-tartaric | 3.22; 4.82 |
| aspartic | 3.86; 9.82 | malonic | 2.83; 5.69 | o-toluic | 3.91 |
| benzoic | 4.19 | mandelic | 3.85 | m-toluic | 4.27 |
| BTC* | 3.36; 4.38; 5.45; 6.63 | 1-naphthoic | 3.70 | p-toluic | 4.36 |
| chloroacetic | 2.85 | 2-naphthoic | 4.17 | uric | 3.89 |
| o-chlorobenzoic | 2.92 | oxalic | 1.23; 4.19 | D 2000** | ~1-2**** |
| citric | 3.14, 4.77; 6.39 | phenylacetic | 4.28 | D 2010*** | ~1-2**** |
| formic | 3.75 | phthalic | 2.89; 5.51 | nitrous | 3.37 |
| glutamic | 2.19; 9.13 | isophthalic | 3.54; 4.60 | phosphoric | 2.12; 7.21; 12.67 |
| glutaric | 4.34; 5.41 | terephthalic | 3.51; 4.82 | phosphorous | 2.00; 6.59 |
| glycine | 2.34; 9.60 | quinolinic | 2.52 | sulfuric | −3; 1.99 |
| glycolic | 3.83 | salicylic | 2.98 | sulfurous | 1.81; 6.91 |
| hippuric | 3.64 | succinic | 4.16; 5.61 | tetraboric | 4.0; 9.0 |

*butane-1,2,3,4-tetracarboxyic acid
**DEQUEST ® 2000 (amino-tri(methylenephosphonic acid))
***DEQUEST ® 2010LA (hydroxyethylidene-1,1-diphosphonic acid) sold as a 60% aqueous solution.
****while amino-tri(methylenephosphonic acid) and hydroxyethylidene-1,1-diphosphonic acid) each have more than one pKa value, estimated to be between 1 and 2 as calculated by ACD/pKa dB software (Advanced Chemistry Development, Inc., Toronto, Canada) . . .

The compositions and methods of the invention provide useful silicon nitride removal rates over a wide range of pH, colloidal silica concentration, and acid component concentration. In some particularly preferred embodiments, the silicon nitride removal rate is about 250 Angstroms per minute (Å/min) or greater when polishing a silicon nitride blanket wafer on a table-top CMP polisher at a down force of about 3.5 pounds per square inch (psi), a platen peed of about 60 revolutions per minute (rpm), a carrier speed of about 56 rpm, and a polishing slurry flow rate of about 100 milliliters per minute (mL/min). As an added benefit, the compositions of the present invention can also provide for selective removal of silicon nitride in the presence of silicon oxide or polysilicon.

The polishing compositions of the invention optionally can include one or more oxidizing agent (e.g., to oxidize a component of the semiconductor surface, such as a metal component). Oxidizing agents suitable for use in the polishing compositions and methods of the present invention include, without limitation hydrogen peroxide, persulfate salts (e.g., ammonium monopersulfate, ammonium dipersulfate, potassium monopersulfate, and potassium dipersulfate), periodate salts (e.g., potassium periodate), salts thereof, and a combination of two or more of the foregoing. Preferably, the oxidizing agent is present in the composition in an amount sufficient to oxidize one or more selected metallic or semiconductor material present in the semiconductor wafer, as is well known in the semiconductor CMP art.

The polishing compositions of the invention can also optionally include suitable amounts of one or more other additive materials commonly included in polishing compositions, such as metal complexing agents, corrosion inhibitors, viscosity modifying agents, biocides, and the like.

In preferred embodiments, the polishing compositions further comprise a biocidal amount of a biocide (e.g., an isothiazolinone composition such as KATHON® biocide, available from Rohm and Haas).

The aqueous carrier can be any aqueous solvent, e.g., water, aqueous methanol, aqueous ethanol, a combination thereof, and the like. Preferably, the aqueous carrier is deionized water.

The polishing compositions of the invention have a pH in the range of about 0.5 units less than the pKa of the acidic component (i.e., a pKa which falls within the range of about 1 to about 4.5) to about 1.5 units greater than the pKa. For example, if the acidic component is phosphoric acid (pKa=2.12, 7.21, 12.67) the pH of the composition can be in the range of about 1.6 to about 3.6 (i.e., about 0.5 less than 2.12 to about 1.5 greater than 2.12. Similarly, if the acidic component is oxalic acid (pKa=1.23, 4.19), the pH of the composition can be in the range of about 0.7 to about 5.7 (i.e., about 0.5 less than 1.23 to about 1.5 greater than 4.19), since both pKa values of oxalic acid fall within the range of 1 to 4.5.

The polishing compositions of the invention can be prepared by any suitable technique, many of which are known to those skilled in the art. The polishing composition can be prepared in a batch or continuous process. Generally, the polishing composition can be prepared by combining the components thereof in any order. The term "component" as used herein includes individual ingredients (e.g., colloidal silica, acids, bases, oxidizing agents, and the like), as well as any combination of ingredients. For example, the colloidal silica can be dispersed in water, and the acidic component can be added, and mixed by any method that is capable of incorporating the components into the polishing composition. Typically, an oxidizing agent, when utilized, is not added to the polishing composition until the composition is ready for use in a CMP process, for example, the oxidizing agent can be added just prior to initiation of polishing. The pH can be further adjusted at any suitable time by addition of an acid or base, as needed.

The polishing compositions of the present invention also can be provided as a concentrate, which is intended to be diluted with an appropriate amount of aqueous solvent (e.g., water) prior to use. In such an embodiment, the polishing composition concentrate can include the various components dispersed or dissolved in aqueous solvent in amounts such that, upon dilution of the concentrate with an appropriate amount of aqueous solvent, each component of the polishing composition will be present in the polishing composition in an amount within the appropriate range for use.

The invention also provides a method of chemically-mechanically polishing a silicon nitride substrate. The method comprises (i) contacting a surface of a silicon nitride-containing substrate with a polishing pad and a polishing composition of the invention as described herein, and (ii) moving the polishing pad relative and the surface of the substrate relative to one another, while maintaining at least a portion of the polishing composition between the pad and the surface, thereby abrading at least a portion of the surface to polish the substrate.

The polishing compositions of the present invention can be used to polish any suitable substrate, and is especially useful for polishing substrates comprising silicon nitride, as well as substrates containing silicon nitride and silicon oxide and/or polysilicon. The compositions of the present invention provide relatively high silicon nitride removal rates at abrasive levels low enough to avoid excessive scratch defects. In particular, the formulation and pH of the CMP composition can be varied to vary the silicon nitride removal rate. In some preferred embodiments, particularly those including about 4 percent or less of colloidal silica, the relative rate of silicon nitride removal exceeds the rate for removal of silicon oxide and/or polysilicon. This selectivity is an additional asset for use in polishing modern semiconductor materials with relatively narrow oxide line widths.

The polishing compositions of the present invention are particularly suited for use in conjunction with a chemical-mechanical polishing apparatus. Typically, the CMP apparatus comprises a platen, which, when in use, is in motion and has a velocity that results from orbital, linear, and/or circular motion, a polishing pad in contact with the platen and moving relative to the platen when in motion, and a carrier that holds a substrate to be polished by contacting and moving relative to the surface of the polishing pad. The polishing of the substrate takes place by the substrate being placed in contact with the polishing pad and a polishing composition of the invention and then moving the polishing pad relative to the substrate, so as to abrade at least a portion of the substrate to polish the substrate.

A substrate can be planarized or polished with a polishing composition of the invention using any suitable polishing pad (e.g., polishing surface). Suitable polishing pads include, for example, woven and non-woven polishing pads, grooved or non-grooved pads, porous or non-porous pads, and the like. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, coformed products thereof, and mixtures thereof.

Desirably, the CMP apparatus further comprises an in situ polishing endpoint detection system, many of which are known in the art. Techniques for inspecting and monitoring the polishing process by analyzing light or other radiation reflected from a surface of the workpiece are known in the art. Such methods are described, for example, in U.S. Pat. No. 5,196,353 to Sandhu et al., U.S. Pat. No. 5,433,651 to Lustig et al., U.S. Pat. No. 5,949,927 to Tang, and U.S. Pat. No. 5,964,643 to Birang et al. Desirably, the inspection or monitoring of the progress of the polishing process with respect to a workpiece being polished enables the determination of the polishing end-point, i.e., the determination of when to terminate the polishing process with respect to a particular workpiece.

The following examples further illustrate the invention but, of course, should not be construed as in any way limiting its scope. As used herein and in the following Examples and claims, concentrations reported as parts per million (ppm) are based on the weight of the active component of interest divided by the weight of the composition (e.g., as milligrams of component per kilogram of composition). For example, DEQUEST® 2010LA is sold as a 60 percent by weight aqueous solution of hydroxyethylidene-1,1-diphosphonic acid; thus, 2000 ppm of DEQUEST® 2010LA refers to 2000 milligrams of hydroxyethylidene-1,1-diphosphonic acid in one kilogram of the composition on an actives basis, which corresponds to about 3300 milligrams of DEQUEST® 2010LA product (60 percent aqueous solution) in 996.7 grams of the CMP composition.

EXAMPLE 1

This example illustrates the effectiveness of the compositions of the present invention for polishing silicon nitride substrates.

Ten different polishing compositions were used to separately chemically-mechanically polish similar silicon nitride blanket wafers (Compositions 1A-1J). Each of the polishing compositions comprised about 0.5 to about 5 percent by weight of colloidal silica (having a mean particle size of about 20 nm). The amount of silica, the amount and type of acid, the pH of the composition, and the pKa of the acid for each composition are shown in Table 2. Examples 1B, 1D, 1F, and 1I are compositions of the invention, while Examples 1A, 1C, 1E, 1G, and 1H are comparative compositions in which the pH of the composition is outside the range of the invention.

The polishing compositions were utilized on a bench-top polisher to polish blanket wafers of silicon nitride under the following polishing conditions: down-force of about 3.5 psi, platen speed of about 60 rpm, carrier speed of about 56 rpm, and a slurry feed rate of about 100 mL per minute (mL/min). The silicon nitride removal rate ("Nitride RR") obtained for each polishing composition was determined. The results are set forth in Table 2.

TABLE 2

Effects of acidic components and pH on silicon nitride removal rates

| Example | Wt % Silica | Acid Component (Amount, ppm) | pH | pKa | Nitride RR Å/min |
|---|---|---|---|---|---|
| 1A(comparative) | 0.5 | D2010 (2000 ppm)* | 4 | 1-2 | 133 |
| 1B (inventive) | 0.5 | D2010 (2000 ppm)* | 2.2 | 1-2 | 641 |
| 1C (comparative) | 0.5 | succinic acid (1180 ppm) | 2.2 | 4.19 | 0 |
| 1D (inventive) | 0.5 | succinic acid (1180 ppm) | 5 | 4.19 | 259 |
| 1E (comparative) | 0.5 | phthalic acid (1660 ppm) | 2.2 | 2.98 | 44 |
| 1F (inventive) | 0.5 | phthalic acid (1660 ppm) | 4 | 2.98 | 383 |
| 1G (comparative) | 2 | 5.5 mS nitric acid (to pH 2.2) | 2.2 | −1.3 | 32 |
| 1H (comparative) | 2 | 70 mS nitric acid (to pH 2.2) | 2.2 | −1.3 | 173 |
| 1I (inventive) | 2 | sulfate (2000 ppm) | 2.2 | 1.99 | 548 |

*DEQUEST ® 2010LA (hydroxyethylidene-1,1-diphosphonic acid)

As is apparent from the results set forth in Table 2, each of the inventive polishing compositions exhibited a silicon nitride removal rate of greater than 250 Å/min. The comparative compositions exhibited considerably lower removal rates.

EXAMPLE 2

This example illustrates the importance of colloidal silica in the compositions of the invention for removal of silicon nitride.

Silicon nitride blanket wafers were polished with a series of different polishing compositions on a bench-top polisher at a down force of about 3.5 psi, a platen speed of about 60 rpm, a carrier speed of about 56 rpm, and a polishing slurry flow rate of about 100 mL/min. All of the polishing compositions were prepared in deionized water with 3000 ppm of sulfuric acid as the acidic component, at a pH of about 2.2, and with either 4 or 8 percent by weight of silica. Examples 2A and 2B included fumed silica in place of the colloidal silica, for comparison purposes. The amounts and type of silica are shown in Table 3, along with the silicon nitride removal rate (RR) observed for each composition.

TABLE 3

Effects of silica type silicon nitride removal rates

| Example | Wt % Silica | Silica type (Amount, ppm) | Nitride RR Å/min |
|---|---|---|---|
| 2A (comparative) | 4 | fumed silica | 28 |
| 2B (comparative) | 8 | fumed silica | 32 |
| 2C (inventive) | 4 | colloidal silica | 873 |
| 2D (inventive) | 8 | colloidal silica | 1029 |

The data in Table 3 clearly indicate the importance of utilizing colloidal silica in the compositions of the present invention, compared to fumed silica, which afforded a low nitride removal rate.

EXAMPLE 3

This example illustrates the effect of colloidal silica concentration on the removal of silicon nitride.

Silicon nitride blanket wafers were polished with a series of different polishing compositions on a bench-top polisher at a down force of about 3.5 psi, a platen speed of about 60 rpm, a carrier speed of about 56 rpm, and a polishing slurry flow rate of about 100 mL/min. All of the polishing compositions were prepared in deionized water with about 2000 ppm of hydroxyethylidene-1,1-diphosphonic acid (DEQUEST® 2010LA) as the acidic component, at a pH of about 2.2, and with 0 to about 8 percent by weight of silica. The amounts of silica used are shown in Table 4, along with the silicon nitride removal rate (RR) observed for each composition.

TABLE 4

Effects of silica concentration on silicon nitride removal rates

| Example | Wt % Silica | Nitride RR Å/min |
|---|---|---|
| 3A (comparative) | 0 | 2 |
| 3B (inventive) | 0.2 | 510 |
| 3C (inventive) | 2 | 853 |
| 3D (inventive) | 4 | 986 |
| 3E (inventive) | 8 | 983 |

The data in Table 4 demonstrate that effective removal of silicon nitride was observed even with silica levels as low as 0.2 percent by weight.

EXAMPLE 4

This example illustrates the effect of acid concentration and colloidal silica concentration on the removal of silicon nitride.

Silicon nitride blanket wafers were polished with a series of different polishing compositions on a bench-top polisher at a down force of about 3.5 psi, a platen speed of about 60 rpm, a carrier speed of about 56 rpm, and a polishing slurry flow rate of about 100 mL/min. All of the polishing compositions were prepared in deionized water with 10 to 1000 ppm of hydroxyethylidene-1,1-diphosphonic acid (DEQUEST® 2010LA) as the acidic component, at a pH of about 2.2, and with 0.5 or 5 percent by weight of silica. The amounts of silica and acid component used are shown in Table 5, along with the silicon nitride removal rate (RR) observed for each composition.

TABLE 5

Effects of acid concentration on silicon nitride removal rates

| Example | Wt % Silica | Acid Component* (Amount, ppm) | Nitride RR Å/min |
|---|---|---|---|
| 4A (inventive) | 0.5 | D2010 (100 ppm) | 450 |
| 4B (inventive) | 0.5 | D2010 (200 ppm) | 591 |
| 4C (inventive) | 0.5 | D2010 (500 ppm) | 612 |
| 4D (inventive) | 0.5 | D2010 (1000 ppm) | 695 |
| 4E (inventive) | 5 | D2010 (10 ppm) | 238 |
| 4F (inventive) | 5 | D2010 (100 ppm) | 705 |
| 4G (inventive) | 5 | D2010 (200 ppm) | 805 |
| 4H (inventive) | 5 | D2010 (500 ppm) | 783 |
| 4I (inventive) | 5 | D2010 (1000 ppm) | 907 |

*DEQUEST ® 2010LA (hydroxyethylidene-1,1-diphosphonic acid)

The data in Table 5 indicate that effective silicon nitride removal can be achieved under a broad range of acid and colloidal silica concentrations.

EXAMPLE 5

This example illustrates the selectivity for removal of silicon nitride relative to silicon oxide.

Silicon nitride and silicon oxide blanket wafers were polished with a series of different polishing compositions. All of the polishing compositions were prepared in deionized water including 0.1 and 1 percent by weight of colloidal silica with about 2060 ppm hydroxyethylidene-1,1-diphosphonic acid (DEQUEST® 2010LA) (Ex. 5A and 5B), about 1660 ppm phthalic acid (Ex. 5C and 5D), and about 2000 ppm sulfuric acid (hydrogen sulfate) (Ex. 5E and 5F) as the acid components as the acid components. These compositions were utilized to polish silicon nitride and silicon oxide blanket wafers on a Mirra polisher at about 4 psi down pressure, about 93 rpm platen speed, about 86 rpm carrier speed, and 150 mL flow rate. The results for these tests are shown in Table 6.

TABLE 6

Effects of acidic components on silicon nitride and silicon dioxide removal rates

| Polishing Composition | Nitride RR (Å/min) | Oxide RR (Å/min) | Selectivity |
|---|---|---|---|
| 5A (0.1% silica) | 100 | 19 | 5.3 |
| 5B (1% silica) | 500 | 70 | 7.1 |
| 5C (0.1% silica) | 450 | 27 | 16.9 |
| 5D (1% silica) | 680 | 130 | 5.2 |
| 5E (0.1% silica) | 120 | 14.5 | 8.2 |
| 5F (1% silica) | 510 | 69 | 7.4 |

The results in Table 6 demonstrate very high selectivity for silicon nitride versus silicon oxide under the polishing conditions evaluated.

EXAMPLE 6

This example illustrates selectivity for removal of silicon nitride relative to polysilicon.

Silicon nitride and polysilicon blanket wafers were polished with two different polishing compositions of the invention on a table-top CMP polisher at a down force of about 3.5 psi, a platen speed of about 60 rpm, a carrier speed of about 56 rpm, and a polishing slurry flow rate of about 100 mL/min. The compositions had a pH of about 2.3 and included about 500 ppm of hydroxyethylidene-1,1-diphosphonic acid (DEQUEST® 2010LA) and either 0.5 or 5 percent by weight of colloidal silica. The silicon nitride and polysilicon removal rates for each composition were determined. CMP of polysilicon typically exhibits an initiation time due to removal of a protective oxide coating on the surface of the silicon. Accordingly, the polysilicon removal rate is determined by plotting the amount of polysilicon removed after 10 seconds, 60 seconds and 180 seconds. The polysilicon removal rate in Å/min is then calculated as the amount of polysilicon removed during the one minute interval between 30 seconds of polishing and 90 seconds of polishing, by reference to the plot.

The composition comprising 0.5 percent by weight colloidal silica exhibited a silicon nitride removal rate of about 600 Å/min, and a polysilicon removal rate of about 130 Å/min. The composition including about 5 percent by weight colloidal silica exhibited a nitride removal rate of about 780 Å/min and a polysilicon removal rate of less than about 100 Å/min. Thus, the composition of the present invention exhibit significant selectivity for removal of silicon nitride versus polysilicon under the same polishing conditions.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A chemical-mechanical polishing (CMP) method for selectively removing silicon nitride in the presence of silicon oxide in a substrate, the method comprising the steps of:
   (a) abrading a surface of a substrate comprising silicon nitride and silicon oxide with a polishing composition including about 0.01 to about 15 percent by weight of colloidal silica, about 10 to about 100,000 ppm of at least one acidic component having a pKa in the range of about 1 to about 4.5, wherein the least one acidic component is selected from the group consisting of an organic phosphonic acid, an acidic heterocyclic compound, a salt thereof, and a combination thereof, and an aqueous carrier therefor, wherein the polishing composition has a pH in the range of about 0.5 pH units less than the pKa of the at least one acidic component to about 1.5 pH units greater than the pKa; wherein a relative rate of silicon nitride removal exceeds a rate for removal of silicon oxide.

2. The method of claim 1 wherein the pH of the polishing composition is not more than about 1 pH unit greater than the pKa of the at least one acidic component.

3. The method of claim 1 wherein the pH of the polishing composition is less than about 1 pH unit greater than the pKa of the at least one acidic component.

4. The method of claim 1 wherein the colloidal silica is present in the composition in an amount in the range of about 0.1 to about 4 percent by weight.

5. The method of claim 1 wherein the at least one acidic component is present in the polishing composition in an amount in the range of about 500 to about 2000 ppm.

6. A chemical-mechanical polishing (CMP) method for selectively removing silicon nitride in the presence of polysilicon in a substrate, the method comprising the steps of:

(a) abrading a surface of a substrate comprising silicon nitride and polysilicon with a polishing composition including about 0.01 to about 15 percent by weight of colloidal silica, about 10 to about 100,000 ppm of at least one acidic component having a pKa in the range of about 1 to about 4.5, wherein the least one acidic component is selected from the group consisting of an organic phosphonic acid, an acidic heterocyclic compound, a salt thereof, and a combination thereof, and an aqueous carrier therefor, wherein the polishing composition has a pH in the range of about 0.5 pH units less than the pKa of the at least one acidic component to about 1.5 pH units greater than the pKa; wherein a relative rate of silicon nitride removal exceeds a rate for removal of polysilicon.

7. The method of claim 6 wherein the pH of the polishing composition is not more than about 1 pH unit greater than the pKa of the at least one acidic component.

8. The method of claim 6 wherein the pH of the polishing composition is less than about 1 pH unit greater than the pKa of the at least one acidic component.

9. The method of claim 6 wherein the colloidal silica is present in the composition in an amount in the range of about 0.1 to about 4 percent by weight.

10. The method of claim 6 wherein the at least one acidic component is present in the polishing composition in an amount in the range of about 500 to about 2000 ppm.

* * * * *